United States Patent [19]
Gow et al.

[11] Patent Number: 5,773,958
[45] Date of Patent: Jun. 30, 1998

[54] APPARATUS FOR DETECTING CELL REVERSAL IN RECHARGEABLE BATTERIES

[75] Inventors: Philippe H. Gow, Birmingham; Robert A. Rogers, Macomb Township; Andrea L. Lijoi, Shelby Township, all of Mich.

[73] Assignee: Ovonic Battery Company, Inc., Troy, Mich.

[21] Appl. No.: 778,486

[22] Filed: Jan. 3, 1997

[51] Int. Cl.[6] .................................................. H01M 10/48
[52] U.S. Cl. ........................ 320/118; 320/134; 320/165; 320/DIG. 20
[58] Field of Search .................................. 320/5, 6, 7, 11, 320/15, 16, 18, 25, 30, 39, 40, 48, 118, 134, 165, DIG. 20; 324/426, 433, 434

[56] References Cited

U.S. PATENT DOCUMENTS

| | | | |
|---|---|---|---|
| 4,316,185 | 2/1982 | Watrous et al. | 320/48 X |
| 5,313,152 | 5/1994 | Wozniak et al. | 320/6 |
| 5,608,304 | 3/1997 | Okumura | 320/5 |
| 5,610,495 | 3/1997 | Yee et al. | 320/6 |

*Primary Examiner*—Edward Tso
*Attorney, Agent, or Firm*—Marc J. Luddy; Marvin S. Siskind; David W. Schumaker

[57] ABSTRACT

An apparatus for monitoring a battery pack having a plurality of serially connected rechargeable batteries. The apparatus comprises a means of detecting cell reversal and a means of protecting the batteries of the battery pack upon detection of cell reversal.

17 Claims, 9 Drawing Sheets

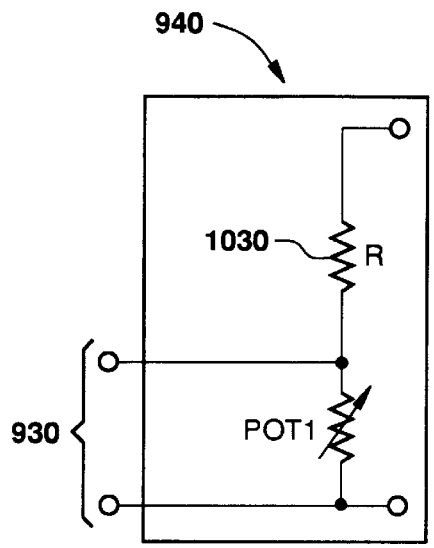
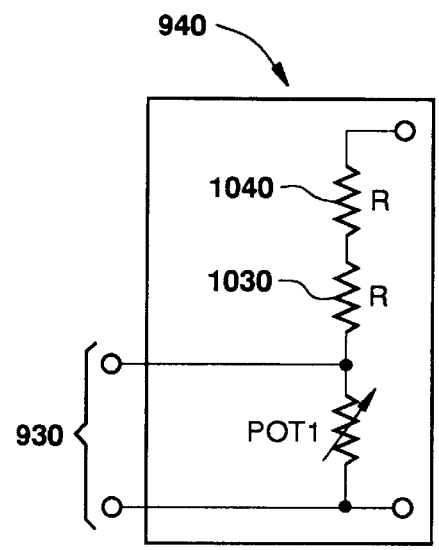
FIG - 10A  FIG - 10B
FIG - 12
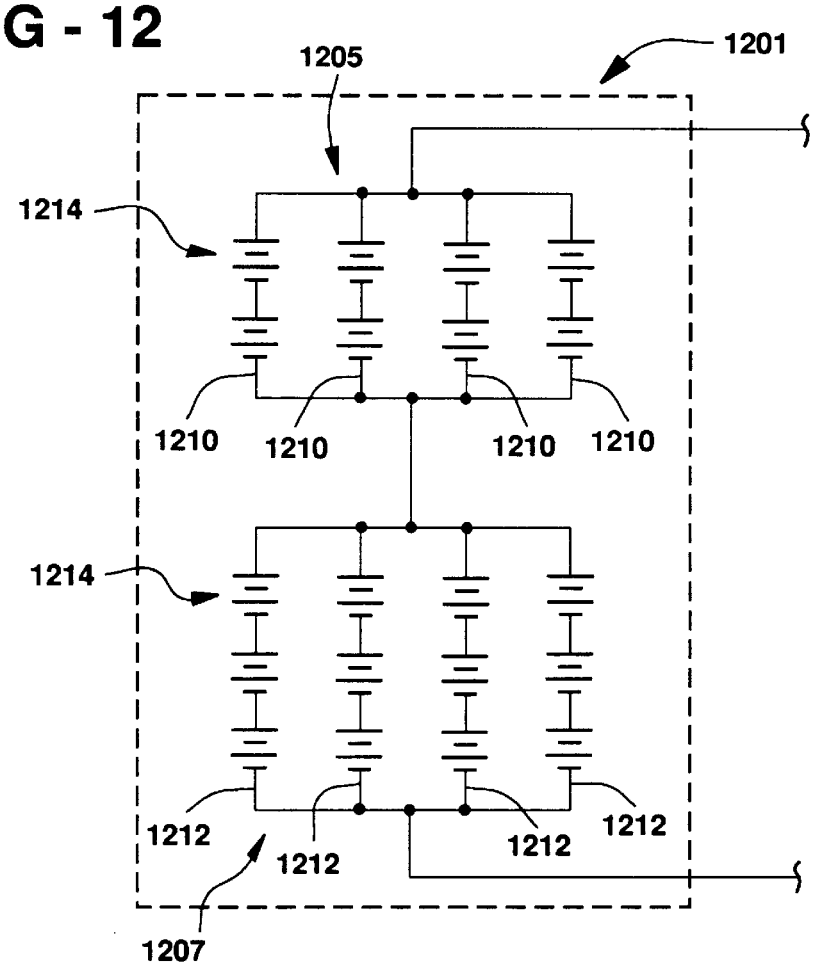

APPARATUS FOR DETECTING CELL REVERSAL IN RECHARGEABLE BATTERIES

FIELD OF THE INVENTION

In general the present invention relates to rechargeable batteries. More specifically, the present invention relates to an apparatus for detecting cell reversal in rechargeable batteries.

BACKGROUND OF THE INVENTION

Rechargeable batteries are used in a variety of industrial and commercial applications such as fork lifts, golf carts, uninterruptable power supplies, and electric vehicles.

Rechargeable lead-acid batteries are a useful power source for starter motors for internal combustion engines. Rechargeable alkaline batteries are used in numerous consumer devices such as calculators, portable radios, and cellular phones. They are often configured into a sealed battery pack that is designed as an integral part of a specific device. Rechargeable alkaline batteries can also be configured as larger batteries that can be used, for example, in industrial, aerospace, and electric vehicle applications. In rechargeable alkaline batteries, weight and portability are important considerations. It is also advantageous for rechargeable alkaline batteries to have long operating lives without the necessity of periodic maintenance.

There are many known types of nickel-based alkaline cells such as nickel cadmium ("Ni—Cd"), nickel metal hydride ("Ni—MH"), nickel hydrogen, nickel zinc, and nickel iron cells. In a Ni—Cd battery, cadmium metal is the active material in the negative electrode. Ni—Cd batteries have a positive electrode comprised of nickel hydroxide material. The negative and positive electrodes are spaced apart in the alkaline electrolyte. Upon application of an electrical potential across the materials of a Ni—Cd battery, the negative electrode undergoes the reaction shown in equation (1):

$$Cd(OH)_2 + 2e^- \underset{discharge}{\overset{charge}{\rightleftharpoons}} Cd + 2OH^- \quad (1)$$

During discharge, this reaction is reversed, Cd is oxidized to $Cd(OH)_2$ and electrons are released.

The reactions that take place at the positive electrode of a Ni—Cd battery are also reversible. The reactions at a nickel hydroxide positive electrode in a Ni—Cd battery are shown in equation (2):

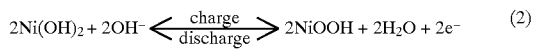
$$2Ni(OH)_2 + 2OH^- \underset{discharge}{\overset{charge}{\rightleftharpoons}} 2NiOOH + 2H_2O + 2e^- \quad (2)$$

Another type of nickel-based rechargeable battery is a Ni—MH battery. Ni—MH batteries also employ a positive electrode comprised of nickel hydroxide material and use an alkaline electrolyte. Upon application of an electrical potential across a Ni—MH battery, the negative electrode material is charged by the absorption of hydrogen and the discharge of a hydroxyl ion, as shown in equation (3):

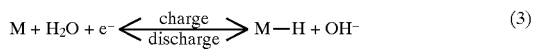
$$M + H_2O + e^- \underset{discharge}{\overset{charge}{\rightleftharpoons}} M-H + OH^- \quad (3)$$

Upon discharge, the stored hydrogen is released to form a water molecule and release an electron.

The reactions that take place at the nickel hydroxide positive electrode of a Ni—MH battery are shown in equation (4):

$$Ni(OH)_2 + OH^- \underset{discharge}{\overset{charge}{\rightleftharpoons}} NiOOH + H_2O + e^- \quad (4)$$

This reaction is identical to that occurring at the positive electrode of a Ni—Cd battery. Similar equations can be written for the other known types of nickel-based rechargeable batteries.

As shown by equation (4), during discharge of a nickel-based rechargeable battery, the nickel of the positive electrode is reduced. As the nickel is reduced, the potential at the positive electrode (as well as the potential between the positive and negative electrodes) diminishes.

In a battery pack comprising a plurality of nickel-based, serially connected rechargeable batteries, the amount of nickel hydroxide positive electrode material (and hence the electrical storage capacity) varies among the individual batteries. During discharge of the battery pack, the battery first depleted of positive electrode material will be driven into "cell reversal" by the higher capacity batteries in the battery pack.

During cell reversal, the "cell-reversed" battery's positive electrode "over-discharges" whereby the electrolysis of water into hydroxide ions and hydrogen gas replaces the reduction of nickel as the dominate reaction, thereby causing a significant drop is the voltage across the battery. Furthermore, the production of hydrogen gas increases the pressure within the battery, forcing open the battery vent and permitting the battery electrolyte to escape.

Cell reversal can occur in battery systems comprising all types of serially connected rechargeable batteries. Hence, proper discharge management is essential to protect rechargeable batteries from excessive discharge which can lead to battery dehydration. There is thus a need for a battery back monitoring system which is capable of detecting cell reversal, and based upon such detection, act to protect the batteries within the battery pack.

SUMMARY OF THE INVENTION

It is an objective of the present invention to provide an apparatus and method for detecting cell reversal in a battery pack. It is another objective of the present invention to protect the batteries in the battery pack from damage upon detection of cell reversal.

These and other objectives are satisfied by an apparatus for monitoring a battery pack having two or more serially connected rechargeable batteries, the battery pack divided into N serially connected battery segments ($S_1 \ldots S_N$) where N is an integer greater than or equal to one, each of the battery segments ($S_1 \ldots S_N$) having two or more of the serially connected rechargeable batteries, the apparatus comprising: a detection means for detecting cell reversal in the battery pack, the detection means comprising: N divider networks ($D_1 \ldots D_N$), each including a first divider resistor serially connected to a second divider resistor at a resistor junction, each of the divider networks ($D_1 \ldots D_N$) connected across the respective of the battery segments ($S_1 \ldots S_N$); N test points ($P_1 \ldots P_N$), each located at a junction between two of the rechargeable batteries within the respective of the battery segments ($S_1 \ldots S_N$); and a voltage comparison means for comparing voltage at each of the test points ($P_1 \ldots P_N$) to voltage at the resistor junction of the respective of the divider networks ($D_1 \ldots D_N$).

These and other objectives are also satisfied by an apparatus for monitoring a battery pack having a plurality of serially connected rechargeable batteries, a positive battery pack terminal, and a negative battery pack terminal, said apparatus comprising: a detection means for detecting cell reversal in said battery pack, said detection means comprising: N test points ($P_1 \ldots P_N$) each located at a unique junction between two of said batteries of said battery pack, N being an integer greater than or equal to one, and said test points ($P_1 \ldots P_N$) sequentially ordered from high to low voltage; a divider network including N+1 serially connected divider resistors ($DR_1 \ldots DR_{N+1}$), said divider resistors ($DR_1 \ldots DR_{N+1}$) forming N resistor junctions ($J_1 \ldots J_N$) where each of said resistor junctions ($J_1 \ldots J_N$) is between the respective of said divider resistors ($DR_1 \ldots DR_{N+1}$) and the next of said divider resistors ($DR_1 \ldots DR_{N+1}$), said divider network connected across said battery pack wherein first of said divider resistors ($DR_1 \ldots DR_{N+1}$) is connected to said positive battery pack terminal, and last of said divider resistors ($DR_1 \ldots DR_{N+1}$) is connected to said negative battery pack terminal; and a voltage comparison means for comparing voltage at each of said test points ($P_1 \ldots P_N$) to voltage at the respective of said resistor junctions ($J_1 \ldots J_N$).

These and other objectives are also satisfied by an apparatus for monitoring a battery pack having two or more serially connected rechargeable batteries, the apparatus comprising: a detection means for detecting cell reversal in the battery pack; and a protection means, responsive to the detection means, for limiting current drawn from the battery pack upon detection of cell reversal.

These and other objectives are also satisfied by a method of detecting cell reversal in a battery pack having two or more serially connected rechargeable batteries, the method comprising the steps of: dividing the battery pack into N serially connected battery segments ($S_1 \ldots S_N$) wherein N is an integer greater than or equal to one, each of the battery segments including two or more of the serially connected rechargeable batteries; connecting each of N divider networks ($D_1 \ldots D_N$) across the respective of the battery segments ($S_1 \ldots S_N$), each of the divider networks ($S_1 \ldots S_N$) including a first divider resistor serially connected to a second divider resistor at a resistor junction; locating each of N test points ($P_1 \ldots P_N$) at a junction between two of the rechargeable batteries within the respective of the battery segments ($S_1 \ldots S_N$); comparing voltage at each of the test points ($P_1 \ldots P_N$) to voltage at the resistor junction of the respective of the divider networks ($D_1 \ldots D_N$); and providing a detection signal when the absolute value of the difference between voltage at any one of the test points ($P_1 \ldots P_N$) and voltage at the resistor junction of the respective of the divider networks ($D_1 \ldots D_N$) is greater than a predetermined value, wherein the predetermined value is less than or equal to one-half nominal battery voltage.

These and other objectives are also satisfied by a method of detecting cell reversal in a battery pack having two or more serially connected rechargeable batteries, the method comprising the steps of: dividing the battery pack into N serially connected battery segments ($S_1 \ldots S_N$) wherein N is an integer greater than or equal to one, each of the battery segments including two or more of the serially connected rechargeable batteries; connecting each of N divider networks ($D_1 \ldots D_N$) across the respective of the battery segments ($S_1 \ldots S_N$), each of the divider networks ($S_1 \ldots S_N$) including a first divider resistor serially connected to a second divider resistor through a voltage drop device; locating each of N test points ($P_1 \ldots P_N$) at a junction between two of the rechargeable batteries within the respective of the battery segments ($S_1 \ldots S_N$); comparing voltage at each of the test points ($P_1 \ldots P_N$) to a voltage window defined by voltage at opposite terminals of the voltage drop device of the respective of the divider networks ($D_1 \ldots D_N$); and providing a detection signal when voltage at any one of the test points ($P_1 \ldots P_N$) is outside the voltage window across the voltage drop device of the respective of the divider networks ($D_1 \ldots D_N$)

BRIEF DESCRIPTION OF THE DRAWINGS

FIG. 10a depicts a simplified schematic diagram of a motor throttle;

FIG. 10b depicts a simplified schematic diagram showing how the voltage control signal from a motor throttle can be regulated;

FIG. 12 depicts a generalized battery pack comprised of two generalized battery segments.

DETAILED DESCRIPTION OF THE INVENTION

Figure 1:
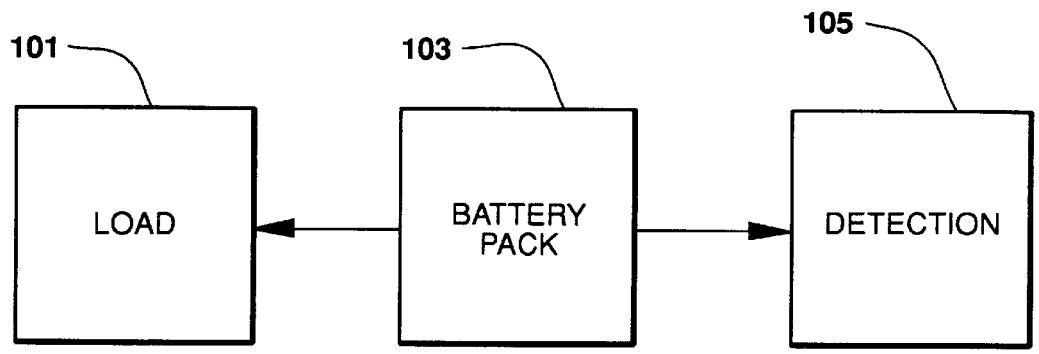
FIG. 1 depicts a system block diagram showing the relationship between the load, battery pack and detection means.

FIG. 1 shows a block diagram of a system incorporating the present invention. FIG. 1 shows a battery pack 103 electrically connected to and supplying power to a load 101. The battery pack 103 includes two or more serially connected rechargeable batteries. The battery pack 103 is monitored by the apparatus of the present invention which comprises a detection means 105 for detecting cell reversal in the battery pack 103.

As used herein, the term "battery" is a single electrochemical cell. Also, as used herein, the "nominal voltage" of a rechargeable battery is defined as the voltage at which the battery is rated. It is assumed that all of the batteries included in the battery pack are rated at the same voltage. Hence, the nominal voltage of each of the rechargeable batteries in the battery pack is the same and this voltage is defined herein as the "nominal battery voltage".

As well, the nominal voltage of a battery segment (defined below) is the nominal voltage of an individual battery (i.e. the nominal battery voltage) multiplied by the number of batteries in that battery segment, the nominal voltage of a battery subsegment (defined below) is the nominal voltage of an individual battery multiplied by the number of batteries within that subsegment, the nominal voltage of a battery pack is the nominal voltage of an individual battery multiplied by the total number of batteries within the battery pack, and the nominal voltage at any node, junction or terminal is the voltage calculated at that node, junction or terminal assuming that each battery in the battery pack is at the nominal battery voltage.

Also, as used herein, the notation $(X_1 \ldots X_N)$ denotes a set of N consecutive elements. The "first" element of $(X_1 \ldots X_N)$ is $X_1$ and the "last" element of $(X_1 \ldots X_N)$ is $X_N$. Given two sets of consecutive elements $(X_1 \ldots X_N)$ and $(Y_1 \ldots Y_M)$ with M>N, for each element $X_i$ of $(X_1 \ldots X_N)$, the "respective" element of $(Y_1 \ldots Y_M)$ is $Y_i$, and the "next" element of $(Y_1 \ldots Y_M)$ is $Y_{i+1}$. For example, for element $X_2$ of $(X_1 \ldots X_N)$, the "respective" element of $(Y_1 \ldots Y_M)$ is $Y_2$, and the "next" element of $(Y_1 \ldots Y_M)$ is $Y_3$.

Also, as used herein, a statement or expression using the generic subscript "i" is true for all elements $(X_1 \ldots X_N)$. For example, the statement that "resistor $X_i$ is connected to the respective diode $Y_i$," means that resistor $X_1$ is connected to diode $Y_1$, resistor $X_2$ is connected to diode $Y_2$, resistor $X_3$ is connected to diode $Y_3$, etc.

Figure 2:
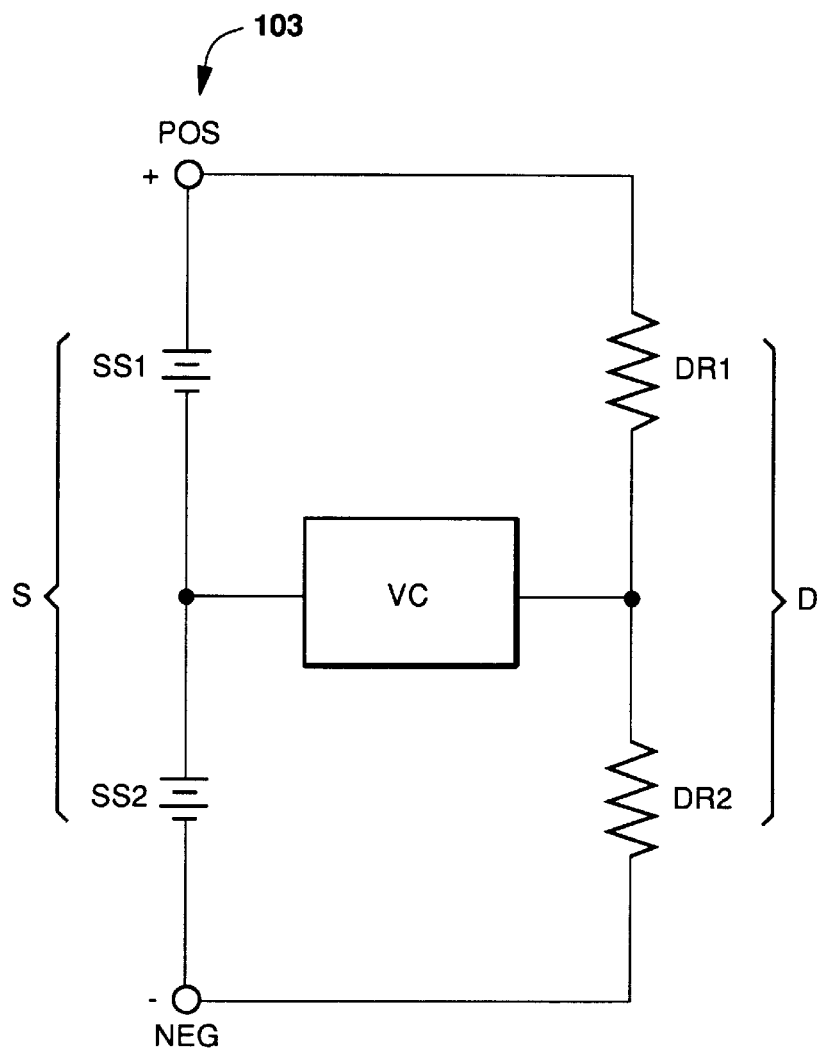
FIG. 2 depicts a schematic diagram of a detection means including a single test point.

FIG. 2 shows a schematic diagram of an embodiment of the detection means 105 for detecting cell reversal in a battery pack 103. Shown are the positive battery pack terminal POS and the negative battery pack terminal NEG of the battery pack 103.

In general, the battery pack is divided into N serially connected battery segments where N is any integer which is greater than or equal to one. Each of the battery segments includes two or more of the serially connected rechargeable batteries of the battery pack. The number of batteries in each of the segments may be different.

In the embodiment shown in FIG. 2, the battery pack 103 includes a single battery segment S having two or more batteries. The detection means 105 is comprised of a divider network D connected across the single battery segment S. The divider network D includes a first divider resistor DR1 serially connected to a second divider resistor DR2 at a resistor junction J. The detection means further includes a test point P located at a junction between two batteries of the battery segment S. Test point P divides the battery segment S into a first battery subsegment SS1 and a second battery subsegment SS2 where each battery subsegment includes one or more rechargeable batteries.

In the embodiment shown in FIG. 2, the divider resistors DR1, DR2 are sized so that the nominal voltage at test point P is substantially equal to the nominal voltage at resistor junction J. Sizing the divider resistors DR1, DR2 as described "balances" the circuit shown in FIG. 2 so that the resistance of divider resistor DR1 divided by the resistance of divider resistor DR2 is substantially equal to the voltage across subsegment 1 divided by the voltage across subsegment 2, or expressed algebraically:

$$\text{resistance}_{DR1}/\text{resistance}_{DR2} = \text{voltage}_{SS1}/\text{voltage}_{SS2} \qquad (5)$$

When one of the batteries goes into cell reversal, that "cell-reversed" battery as well as the battery subsegment including the cell-reversed battery rapidly drops in voltage. This voltage drop "unbalances" the circuit whereby expression (5) above is no longer true, and the voltage at test point P is no longer substantially equal to the voltage at resistor junction J.

The detection means 105 further comprises a voltage comparison means VC for comparing the voltage at the test point P to the voltage at resistor junction J. The voltage comparison means is configured to provide a detection signal when the absolute value of the difference between the voltage at test point P and the voltage at resistor junction J is greater than a predetermined value (i.e., $|\text{voltage}_P - \text{voltage}_J| > \text{predetermined value}$). Preferably, the predetermined value is less than or equal to one-half the difference between the nominal battery voltage and the battery voltage after cell reversal (.i.e., $0.5 \times [\text{battery voltage}_{NOMINAL} - \text{battery voltage}_{REVERSAL}]$). More preferably, the predetermined value is less than or equal to one-half the nominal battery voltage.

The voltage comparison means may be implemented using a voltage comparator VC which compares the voltage at test point P to the voltage at resistor junction J.

Figure 3:
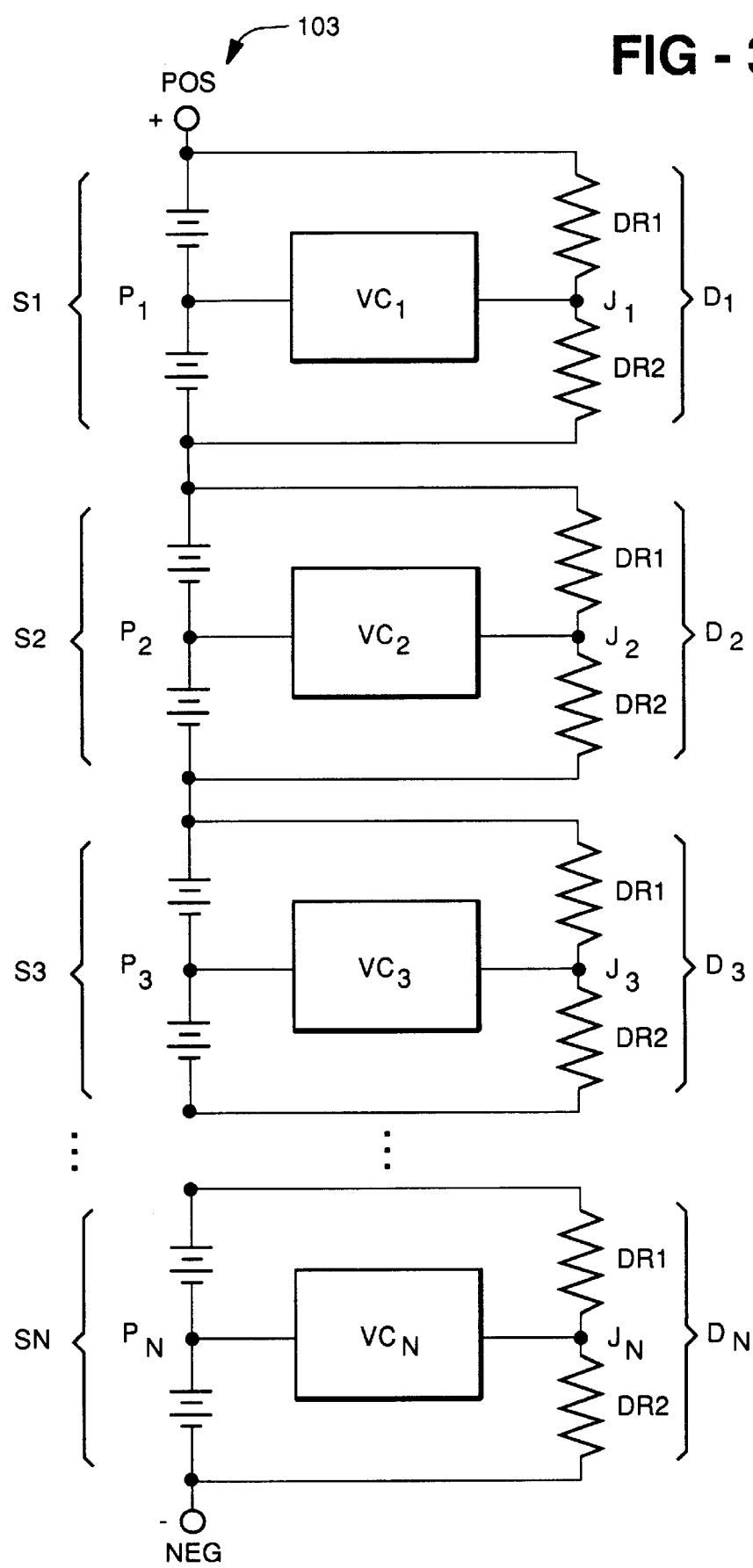
FIG. 3 depicts a schematic diagram of a detection means including one or more test points.

FIG. 3 shows a generalization of the embodiment of the detection means shown in FIG. 2. In FIG. 3, the battery pack 103 is divided into N serially connected battery segments $(S_1 \ldots S_N)$ where each battery segment includes two or more of the serially connected rechargeable batteries of the battery pack. The detection means 105 comprises N divider networks $(D_1 \ldots D_N)$. Each divider network $D_i$ is connected across the respective battery segment $S_i$. (Hence, divider network $D_1$ is connected across battery segment $S_1$, divider network $D_2$ is connected across battery segment $S_2$, etc., for $1 \leq i \leq N$.) Also, each divider network $D_i$ includes a first divider resistor DR1 and a second divider resistor DR2 serially connected at a resistor junction $J_i$.

The detection means 105 further comprises N test points $(P_1 \ldots P_N)$ where each test point $P_i$ is located at a junction between two of the rechargeable batteries that are located within the respective battery segment $S_i$. Each test point $P_i$ divides the respective battery segment $S_i$ into a first battery subsegment SS1 and a second battery subsegment SS2, each including one or more rechargeable batteries.

The first and second divider resistors DR1, DR2 of each divider network $D_i$ are sized so that the nominal voltage at each test point $P_i$ is substantially equal to the nominal voltage at the respective resistor junction $J_i$. Sizing the divider resistors this way "balances" the circuit shown in FIG. 3 so that expression (5) ($\text{resistance}_{DR1}/\text{resistance}_{DR2} = \text{voltage}_{SS1}/\text{voltage}_{SS2}$) holds for each divider network $D_i$.

Hence, with divider resistors DR1, DR2 sized as described and with batteries at or near the nominal battery voltage, the voltage at each test point $P_i$ is substantially equal to the voltage at the respective junction $J_i$, and expression (5) above is true for each divider network $D_i$. However, when a battery undergoes cell reversal, the voltage across the "cell-reversed" battery rapidly drops, and the voltage across the battery segment and battery subsegment including the cell-reversed battery drop accordingly. Expression (5) is no longer true for this battery segment. Moreover, the voltage at the test point located within this battery segment and the voltage at the resistor junction within the divider network connected across this battery segment will be significantly different. (Hence, if the cell-reversed battery is within battery segment $S_3$, then the voltage at test point $P_3$ and the voltage at resistor junction $J_3$ will be significantly different.)

The detection means shown in FIG. 3 further comprises a voltage comparison means for comparing the voltage at each test point $P_i$ to the voltage at the respective resistor junction $J_i$. The voltage comparison means is configured to provide a detection signal when the absolute value of the voltage difference between any test point $P_i$ and the respective resistor junction $J_i$ is greater than a predetermined value (i.e., |voltage$_{Pi}$–voltage$_{Ji}$|>predetermined value, for $1 \leq i \leq N$). Preferably, the predetermined value is chosen to be less than or equal to one-half the difference between the nominal battery voltage and the battery voltage after cell reversal (i.e., 0.5×[batteryvoltage$_{NOMINAL}$–batteryvoltage$_{REVERSAL}$]). More preferably, the predetermined value is chosen to be less than or equal to one-half the nominal battery voltage.

Generally, the voltage comparison means may be embodied by one or more voltage comparators. Preferably, as shown in FIG. 3, the voltage comparison means may be embodied by N voltage comparators ($VC_1 \ldots VC_N$). Each of the voltage comparator ($VC_1 \ldots VC_N$) may be implemented using one or more operational amplifiers. Alternately, the voltage comparison means may be implemented using a processor means which periodically makes the aforementioned voltage comparisons and provides the detection signal upon detection of cell reversal.

Figure 4:
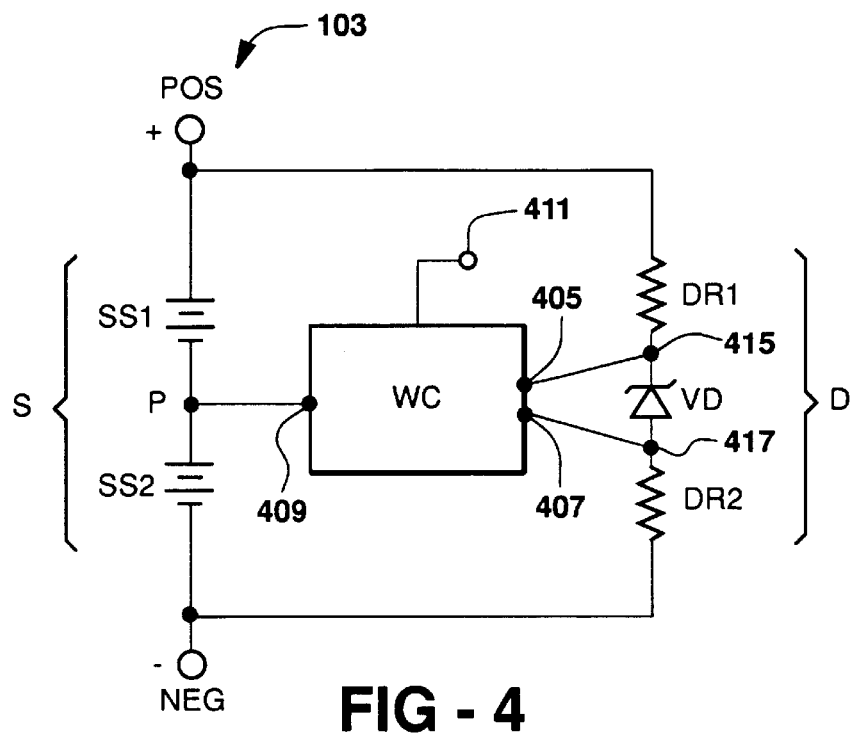
FIG. 4 depicts a schematic diagram of a detection means including a single test point and a divider network having a voltage drop device.

FIG. 4 shows another embodiment of the detection means 105. In FIG. 4 the battery pack is a single battery segment including a plurality of rechargeable batteries. In this embodiment, the detection means 105 comprises a divider network D connected across the single battery segment S. The divider network D includes a first divider resistor DR1 serially coupled to a second divider resistor DR2. The divider network D further includes a voltage drop device VD serially coupled between the first and second divider resistors DR1, DR2. The voltage drop device VD may be a voltage regulator diode such as one from the Motorola LM285/LM385 series. Generally, the voltage drop device VD is chosen so that the voltage drop across the voltage drop device VD forms the appropriate voltage window. Preferably, the voltage drop device VD is chosen so that the voltage drop across the device is less than or equal to the difference between the nominal battery voltage and the battery voltage after cell reversal (battery voltage$_{NOMINAL}$–battery voltage$_{REVERSAL}$) More preferably, the voltage drop device VD is chosen so that the voltage drop of the device is less than the nominal battery voltage. Alternatively, the voltage drop device may be a resistive element.

The embodiment of the detection means 105 shown in FIG. 4 further comprises a test point P located at a junction between two batteries of the battery pack. Test point P divides the battery segment into two battery subsegment SS1 and SS2. The first and second divider resistors DR1, DR2 are sized so that the nominal voltage at test point P is the average of the nominal voltages at the opposite terminals of the voltage drop device VD (i.e. as shown in FIG. 4, terminals 415, 417 are the opposite terminals of voltage drop device VD). As defined above, the nominal voltage at a node, terminal or junction is the calculated voltage at that node, terminal or junction assuming that each battery is at the nominal battery voltage (i.e. the rated voltage).

Sizing the divider resistors DR1, DR2 as described "balances" the circuit shown in FIG. 4 so that, with batteries at or near the nominal battery voltage, the voltage at test point P is substantially equal to the average of the voltages on opposite terminals of the voltage drop device VD (i.e. the voltage at test point P is at or near the center of the voltage window defined by the voltage drop device VD).

However, when one of the batteries in the battery pack undergoes cell reversal, the voltage across the cell-reversed battery as well as the subsegment (i.e. either SS1 or SS2) including the cell-reversed battery rapidly drop. This "unbalances" the circuit shown in FIG. 4 whereby (with the voltage drop device VD appropriately chosen) the voltage at test point P moves outside the voltage window defined by the voltage drop device VD.

In the embodiment shown in FIG. 4, the detection means further comprises a voltage comparison means for comparing the voltage at the test point P to the voltage window defined by the voltages at the opposite terminals of voltage drop device VD. The voltage comparison means provides a detection signal when the voltage at test point P is outside the voltage window, thereby indicating the detection of cell reversal.

In the embodiment shown in FIG. 4, the comparison means is implemented by a window comparator WC. Window comparator WC has an upper-limit input 405 and a lower-limit input 407. Upper-limit input 405 and lower-limit input 407 are connected to the terminals of the voltage drop device VD having the higher and lower voltages, respectively. These correspond to terminals 415 and 417, respectively, in FIG. 4. The window comparator WC has test input 409 that is connected to test point P. The window comparator WC also has a window output 411.

Figure 5:
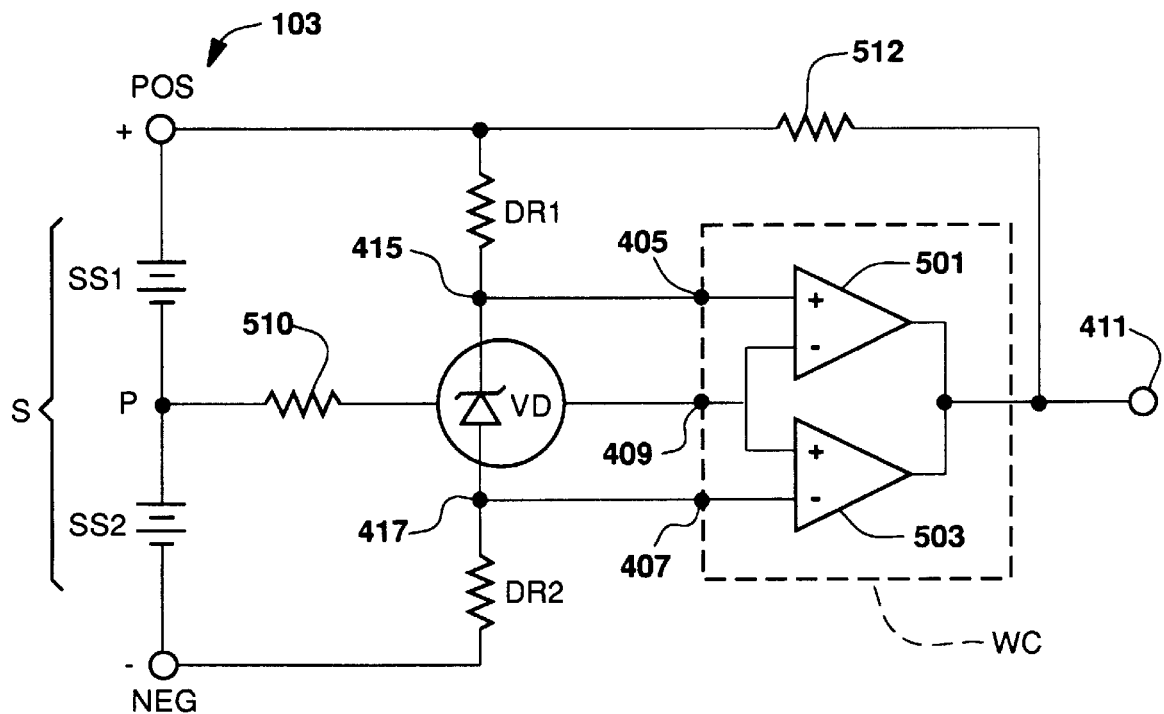
FIG. 5 depicts a schematic diagram showing how the window comparator may be implemented using operational amplifiers.

The window comparator WC in FIG. 4 may be implemented using a pair of operational amplifiers. This is shown in FIG. 5. First and second operational amplifiers 501 and 503 are connected so that the inverting input of the first operational amplifier 501 is connected to the noninverting input of the second operational amplifier 503. The connected inputs jointly form test input 409 of the window comparator WC. In this embodiment, test input 409 is connected to the test point P through a current limiting resistor 510. The noninverting input of the first operational amplifier 501 is the upper-limit input 405 of the window comparator WC while the inverting input of the second operational amplifier 503 is the lower-limit input 407. The outputs of the first and second operational amplifiers are coupled together to form window output 411. In this implementation, the window output 411 is connected to the positive battery pack terminal POS of the battery pack through a current limiting resistor 512.

Alternatively, the voltage comparison means may be implemented by a processor means which makes the appropriate voltage comparisons and provides a detection signal when the voltage at the test point P is outside the voltage window.

Figure 6:
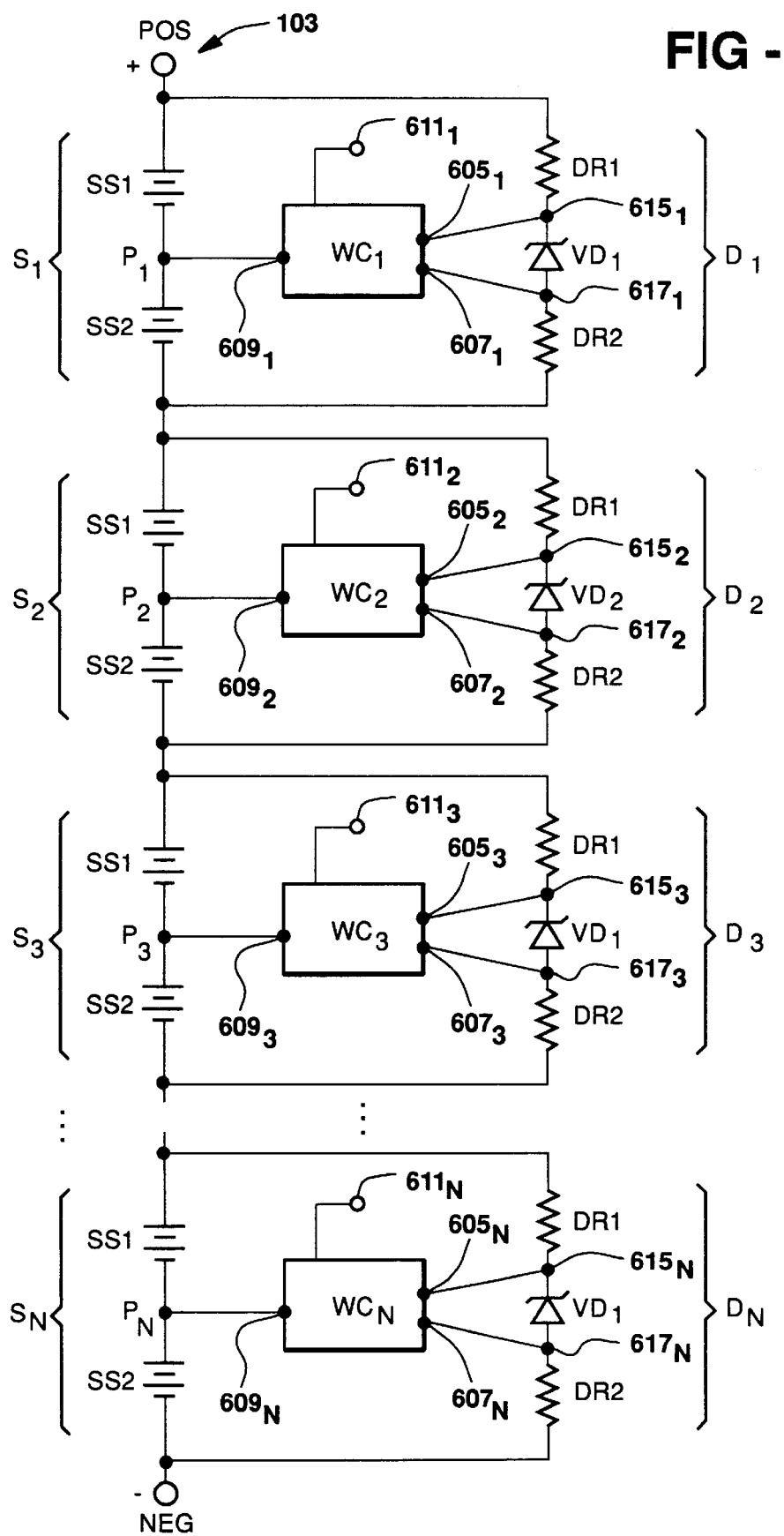
FIG. 6 depicts a schematic diagram of a detection means including one or more test points and one or more divider networks each having a voltage drop device.

The detection means shown in FIG. 4 may be generalized for the case in which the battery pack is divided into N serially connected battery segments ($S_1 \ldots S_N$), where N is an integer greater than or equal to one. This is shown in FIG. 6. In this case, the detection means comprises N divider networks ($D_1 \ldots D_N$) where each divider network $D_i$ is connected across the respective battery segment $S_i$. Each divider network $D_i$ comprises a first divider resistor DR1 serially connected to a second divider resistor DR2 through a voltage drop device $VD_i$.

The voltage drop devices ($VD_1 \ldots VD_N$) are sized to create the proper voltage window across each voltage drop device $VD_i$. Preferably, the voltage drop across each voltage drop device $VD_i$ is less or equal to the difference between the nominal battery voltage and the battery voltage after cell reversal (i.e. battery voltage$_{NOMINAL}$–battery voltage$_{REVERSAL}$). More preferably, the voltage drop devices ($VD_1 \ldots VD_N$) are sized so that the voltage drop across each voltage drop device $VD_i$ is less than or equal to the nominal battery voltage.

The divider resistors DR1, DR2 for each divider network $D_i$ are sized so that the nominal voltage at each test point $P_i$ is substantially equal to the average of the nominal voltages at opposite terminals of the respective voltage drop device $VD_i$. When the divider resistors chosen as described and with batteries at or near their nominal voltages, the voltage at each test point $P_i$ is at or near the center of the voltage window defined by the voltages on opposite terminals of the respective voltage drop device $VD_i$ (i.e. as shown in FIG. 6, the terminals 615$_i$ and 617$_i$ of the respective voltage drop device $VD_i$). When one of the batteries undergoes cell reversal, the voltage of this cell-reversed battery rapidly drops, and the voltage of the battery segment and battery subsegment including the cell-reversed battery drops accordingly. When this occurs, the voltage at the test point located within the battery segment including the cell-reversed battery will move outside the voltage window defined by the respective voltage drop device (for example, if the cell-reversed battery is located within battery segment $S_3$, then the voltage at test point $P_3$ will move outside the voltage window defined by voltage drop device $VD_3$).

The detection means shown in FIG. 6 includes a voltage comparison means which compares the voltage at each test point $P_i$ to the voltage window defined by the voltages on opposite terminals of the respective voltage drop device $VD_i$. When the voltage comparison means detects that the voltage at any of the test points $P_i$ is outside the voltage window of the respective voltage drop device $VD_i$, it provides a detection signal indicating the occurrence of cell reversal.

Generally, the voltage comparison means may be embodied by one or more window comparators. As shown in FIG. 6, the voltage comparison means may be implemented using N window comparators ($WC_1 \ldots WC_N$). Each window comparator $WC_i$ has an upper-limit input 605$_i$ and a lower-limit input 607$_i$ electrically connected to the terminals 615$_i$ and 617$_i$, respectively, of the respective voltage drop device $VD_i$. Each window comparator $WC_i$ has a test input 609$_i$ electrically connected to the respective test point $P_i$. Each window comparator $WC_i$ also has a window output 611$_i$. Each window comparator $WC_i$ may be implemented using a pair of operational amplifiers. The voltage comparison means may also be implemented using a processor means which makes the aforementioned comparisons.

Figure 7:
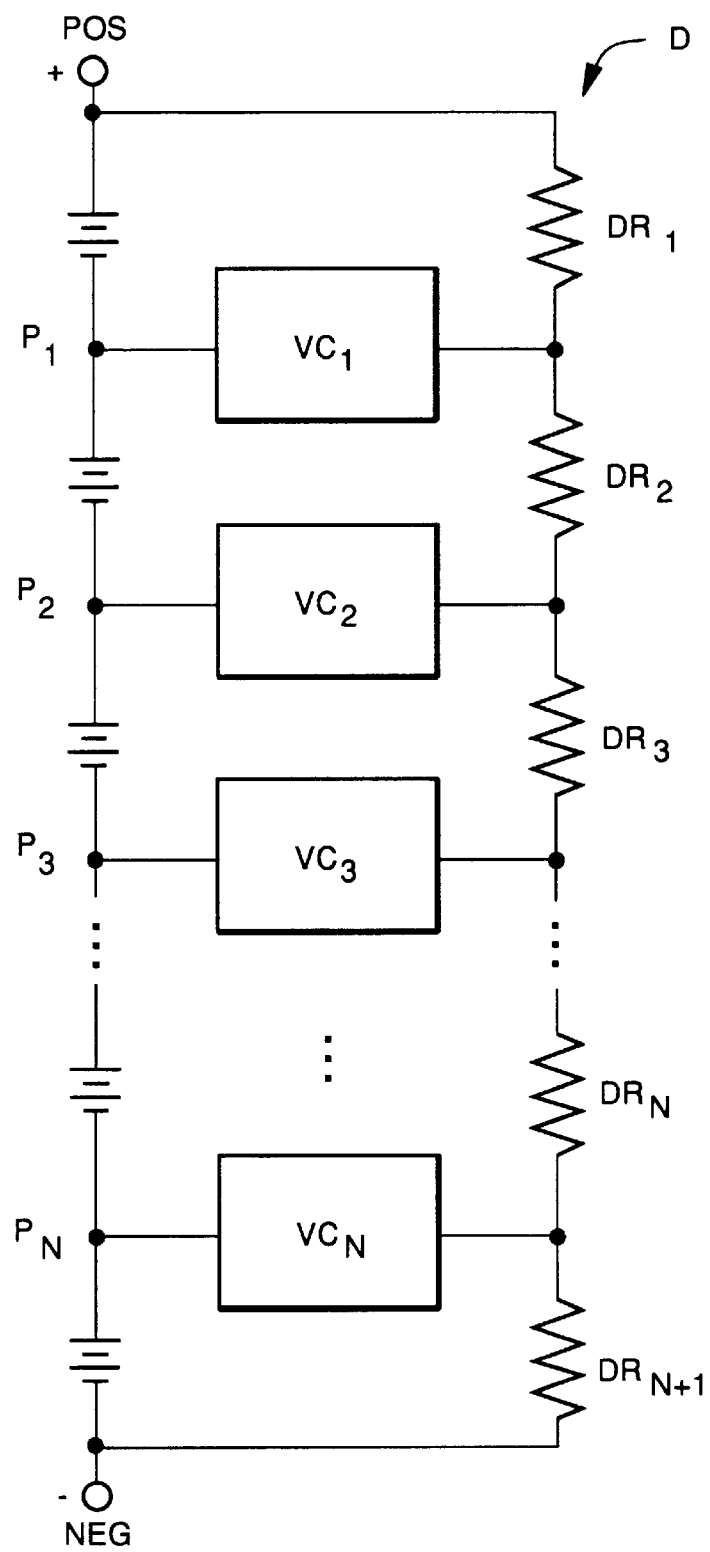
FIG. 7 depicts a schematic diagram of a detection means including one divider network connected across an entire battery pack.
Figure 8:
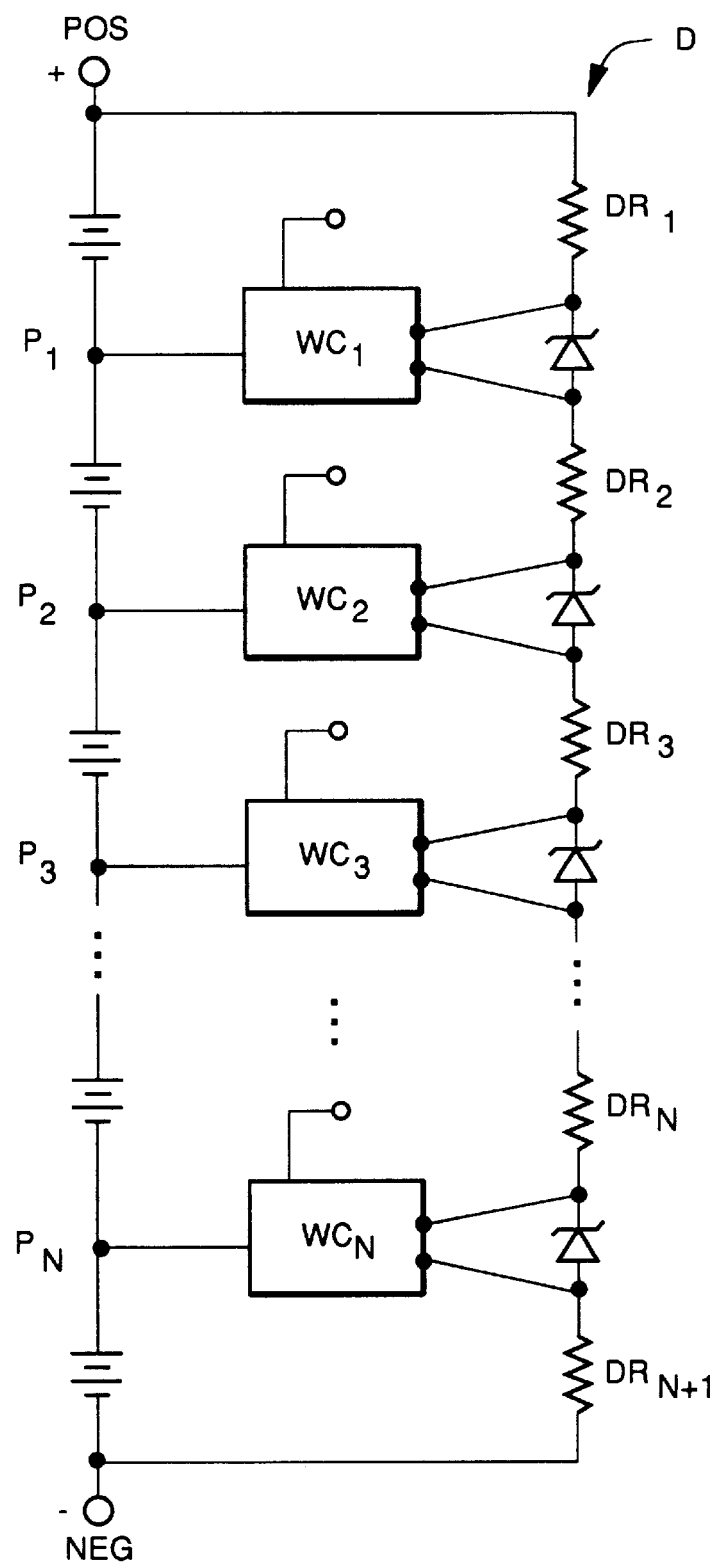
FIG. 8 depicts a schematic diagram of a detection means including a single divider network connected across an entire battery pack where the divider network includes one or more voltage drop devices.

Alternative embodiments of the detection means are shown in FIGS. 7 and 8. FIG. 7 shows an embodiment of the detection means comprising N test points ($P_1 \ldots P_N$) each located at a unique junction between two of the batteries of the battery pack. As previously defined, N is an integer greater than or equal to one. The test points ($P_1 \ldots P_N$) are sequentially ordered from high to low voltage (where voltage is measured from the test point $P_i$ to the negative battery pack terminal). The detection means further comprises a divider network D including N+1 serially connected divider resistors ($DR_1 \ldots DR_{N+1}$). The divider network D is placed across the battery pack so that the "first" divider resistor $DR_1$ is connected to the positive battery pack terminal POS and the "last" divider resistor $DR_{N+1}$ is connected to the negative battery pack terminal NEG. The divider resistors ($DR_1 \ldots DR_{N+1}$) form N resistor junctions ($J_1 \ldots J_N$) ordered so that each resistor junction $J_i$ is between the respective divider resistor $DR_i$ and the "next" divider resistor $DR_{i+1}$. Preferably, the divider resistors ($DR_1 \ldots DR_{N+1}$) are sized so that the nominal voltage at each test point $P_i$ is substantially equal to the nominal voltage at the respective resistor junction $J_i$.

The embodiment of the detection means shown in FIG. 7 further includes a voltage comparison means for comparing voltage at each test point $P_i$ to voltage at the respective resistor junction $J_i$. The voltage comparison means may be implemented by one or more voltage comparators. As shown in FIG. 7, the voltage comparison means is implemented using N voltage comparators ($VC_1 \ldots VC_N$). The voltage comparison means provides a detection signal, indicating cell reversal, when the absolute value of the difference between voltage at any test point $P_i$ and voltage at the respective resistor junction $J_i$ is greater than a predetermined value. Preferably, the predetermined value is less than or equal to one-half the difference between the nominal battery voltage and the battery voltage after reversal. More preferably, the predetermined value is less than or equal to one-half the nominal battery voltage.

FIG. 8 shows yet another embodiment of the detection means. In this embodiment, divider network D comprises N+1 serially connected divider resistors ($DR_1 \ldots DR_{N+1}$) and further comprises N voltage drop devices ($VD_1 \ldots VD_N$). Each voltage drop device $VD_i$ is coupled between the respective divider resistor $DR_i$ and the next divider resistor $DR_{i+1}$. In the embodiment shown in FIG. 8, the divider resistors ($DR_1 \ldots DR_{N+1}$) are sized so that the nominal voltage at each test point $P_i$ is the average of the nominal voltages at opposite terminals of the respective voltage drop device $VD_i$. Preferably, the voltage drop devices ($VD_1 \ldots VD_N$) are chosen so that the voltage drop across each device is less than or equal to the difference between the nominal battery voltage and the battery voltage after cell reversal. More preferably, the voltage drop across device is chosen to be less than or equal to the nominal battery voltage.

The embodiment of the detection means shown in FIG. 8 further includes a voltage comparison means which compares the voltage at each test point $P_i$ to the voltage window defined by nominal voltage at opposite terminals of the respective voltage drop device $VD_i$. The voltage comparison means provides a detection signal indicating cell reversal when the voltage at any test point $P_i$ is outside the voltage window of the respective voltage drop device $VD_i$. The voltage comparison means may be implemented by one or more window comparators. Shown in FIG. 8, the voltage comparison means is implemented using N window comparators ($WC_1 \ldots WC_N$).

Figure 9A:
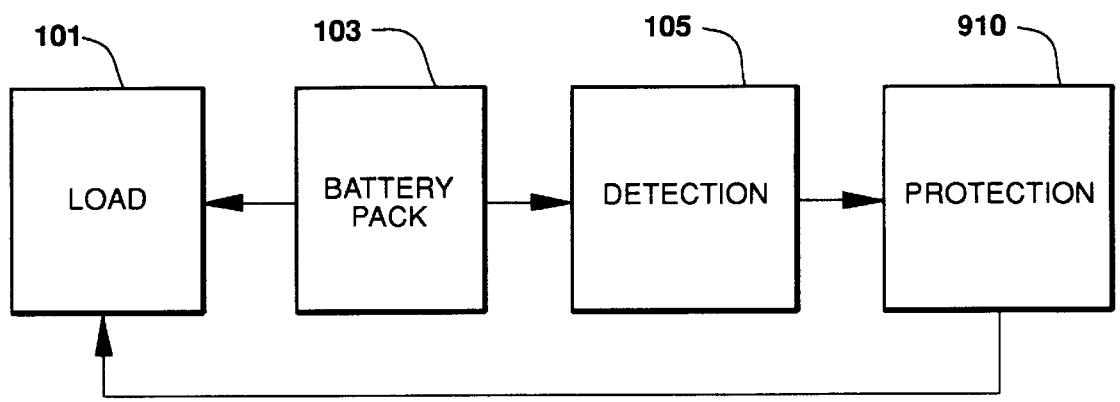
FIG. 9a depicts a system block diagram showing the relationship of the load, battery pack, detection means, and protection means.

As shown in FIG. 9*a*, the apparatus of the present invention may further comprise a protection means 910, responsive to the detection means 105, for protecting the cell-reversed battery from damage upon detection of cell reversal. During cell-reversal, current from the higher capacity batteries (drawn by loads connected to the battery pack) causes the positive electrode of the cell-reversed battery to over-discharge, resulting in production of hydrogen gas. The gas forces open the battery vent resulting in loss of battery electrolyte and eventual destruction of the battery. The protection means 910 protects the battery pack 103 by limiting the amount of current drawn from the battery pack 103 by the various loads (represented by load 101 in FIG. 9*a*).

Figure 9B:
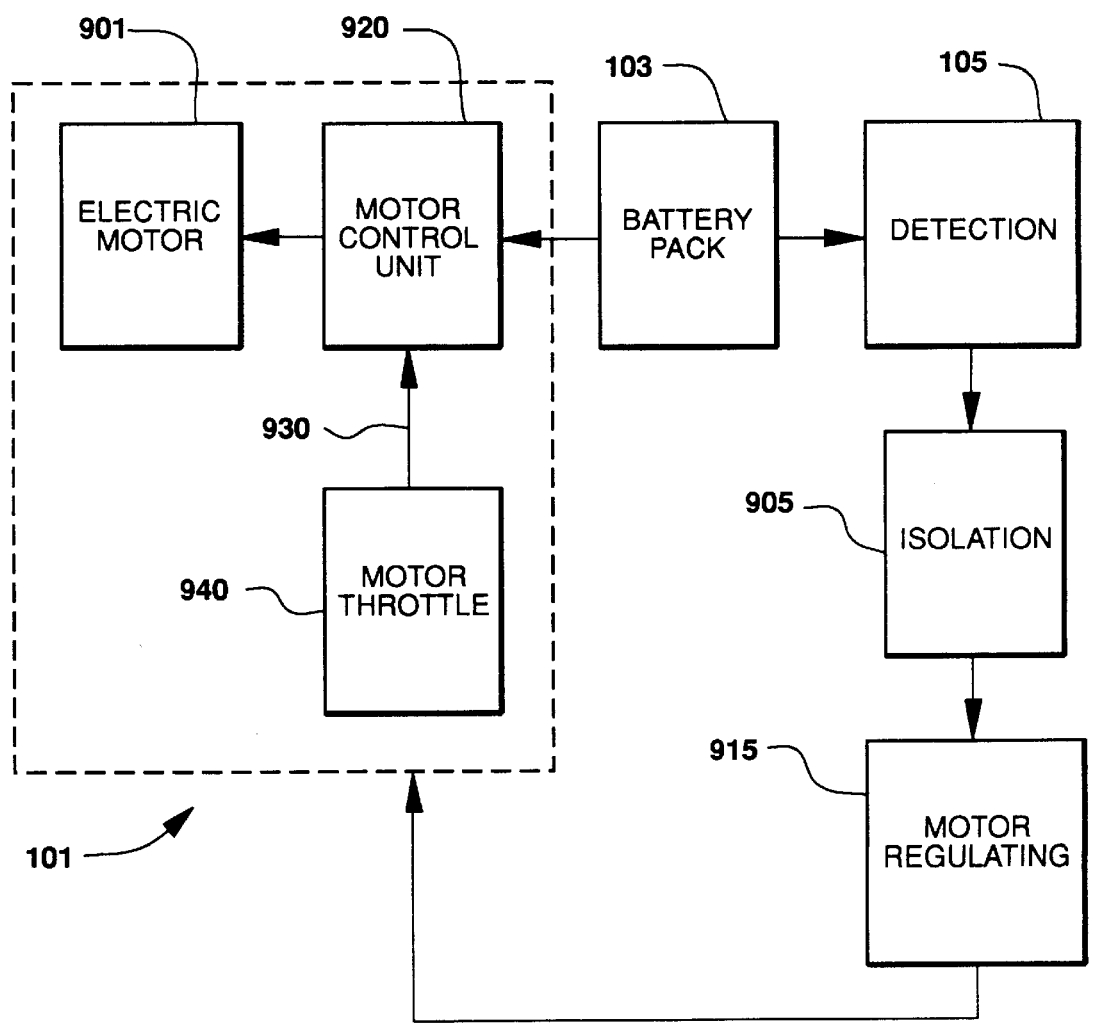
FIG. 9b depicts a system block diagram showing how the present invention may be used when the battery pack is driving an electric motor.

FIG. 9*b* is a system block diagram showing how the present invention may be used when the load 101 includes an electric motor 901. The electric motor can be any voltage controlled AC or DC motor. The protection means 910 comprises a motor regulating means 915 which, upon detection of cell reversal, limits the current drawn from the battery pack 103 by reducing the maximum amount of current that the electric motor 901 can draw from the battery pack 103. In one embodiment of the motor regulating means 915, the motor regulating means 915 operates by limiting the voltage applied to the electric motor 901 for powering the electric motor 901. Limiting the voltage applied to the electric motor limits the torque of the motor, thereby limiting the current drawn by the motor.

In the system block diagram shown in FIG. 9b, the voltage necessary for powering the electric motor is applied to the electric motor via a motor control unit 920. The magnitude of the voltage applied by the motor control unit 920 is controlled by a motor control signal 930 that is provided by a motor throttle 940. Adjusting the motor throttle 940 thereby controls the motor control signal 930 which thereby controls the voltage applied to the electric motor 901 via the motor control unit 920.

An isolation means 905 may be serially coupled between the detection means 105 and the motor regulating means 915 to isolate voltages and references between the detection means 105 and the motor regulating means 915. The isolation means 905 may be implemented by one or more opto-isolators. In the embodiment shown in FIG. 9b, the motor regulating means 915 is responsive to the detection means 105 through the isolation means 905.

In one embodiment, the motor regulating means 915 operates by regulating the voltage control signal 930 transmitted from the motor throttle 930 to the motor control unit 920. Upon detection of cell reversal by the detection means 105, the motor regulating means 915 adjusts the voltage control signal 930 to limit the voltage powering the electric motor 901.

As shown in FIG. 10a, the motor throttle may be viewed as a divider network comprising a potentiometer POT1 serially coupled to a resistor R1030. In the embodiment shown in FIG. 10a, the motor control signal 930 is simply the voltage across the potentiometer POT1. Decreasing the resistance of the potentiometer POT1 or increasing the resistance of resistor R1030 lowers the voltage across the potentiometer POT1. The motor control unit responds by lowering the voltage applied to the electric motor 901.

As shown in FIG. 10b, upon detection of cell reversal, the motor regulating means 915 effectively "increases" the resistance of resistor R1030 by coupling at least one additional resistor R1040 is series with resistor R1030. As described, this lowers the voltage across the potentiometer POT1, thereby lowering the voltage applied to the electric motor 901 for powering the electric motor 901.

Figure 11:
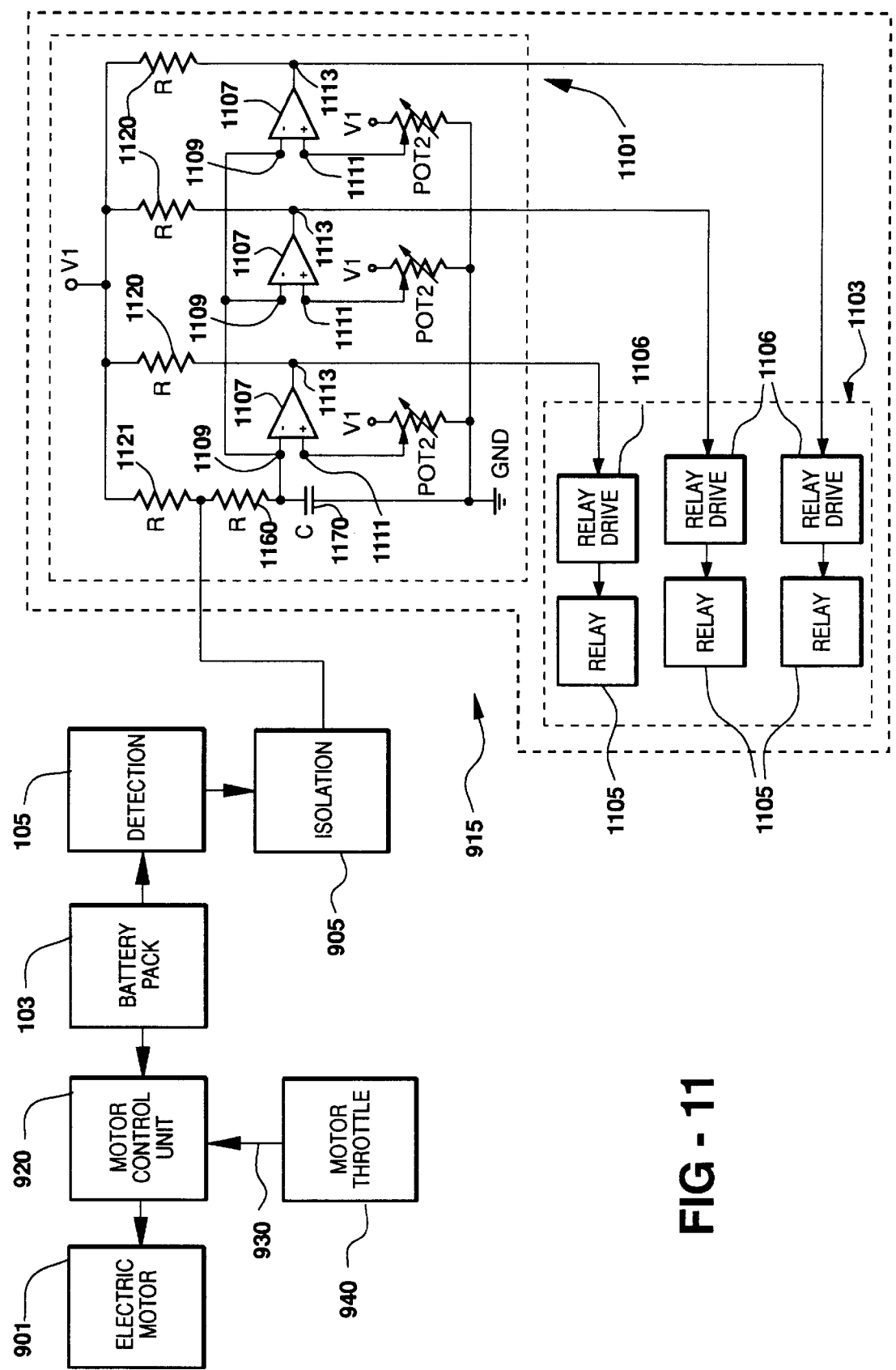
FIG. 11 depicts a schematic diagram of an embodiment of the motor regulating means for protecting a battery pack that is being used to drive an electric motor.

FIG. 11 shows a schematic diagram of an embodiment of the motor regulating means 915. The motor regulating means 915 comprises a relay means 1103 for switching the resistors R1040 in series with the resistor R1030. The motor regulating means 915 further comprises a relay control means 1101 for controlling the timing of the aforementioned switching. The relay means 1103 is responsive to the relay control means 1101. In the embodiment shown, relay control means 1101 is electrically connected to the detection means 105 through an isolation means 905 and is responsive to the detection means 105.

In the embodiment shown in FIG. 11, relay means 1103 comprises one or more relays 1105, and a driver 1106 for supplying each relay 1105 with sufficient current for switching. Each driver 1106 may implemented by one or more transistors.

In the embodiment shown in FIG. 11, the relay control means 1101 comprises one or more voltage comparators 1107. Each voltage comparator 1107 has a variable input 1109, a reference input 1111, and a comparator output 1113.

The variable input 1109 is connected to a variable voltage source. In the embodiment shown in FIG. 11, the variable voltage source is implemented by a timing resistor R1160 and a timing capacitor C1170 connected in series. The variable input 1109 of each voltage comparator is connected to the junction of the timing resistor R1160 and timing capacitor C1170. The voltage at the variable input 1109 increases at a rate dependant on the values of the timing resistor R1160 and the timing capacitor C1170. The values are chosen to control the timing of relay switching.

Each reference input 1111 is connected to a reference voltage. In the embodiment shown in FIG. 11, the reference voltage is provided by potentiometer POT2 connected at one end to voltage powering point V1 and at the other end to ground GND. Each comparator output 1113 is connected to an input of a relay driver 1106.

FIG. 11 also shows how each voltage comparator 1107 may be implemented using an operational amplifier. In this implementation, the inverting and noninverting inputs of each operational amplifier are the variable and reference inputs 1109, 1111, respectively, of the voltage comparator 1107. The outputs of each operational amplifier are connected to current limiting resistors R1120.

In the embodiment shown in FIG. 11, the detection means 105 is electrically coupled to the motor regulating means 915 through the isolation means 905. The isolation means 905 is electrically coupled to the junction between the timing resistor R1160 and timing capacitor C1170. Upon detection of cell reversal, timing capacitor C1170 charges, and the voltage at variable voltage input 1109 rises. When the voltage at variable voltage input 1109 rises above that of reference input 1107, the voltage at comparator output 1113 turns on relay driver 1106, switching relay 1105 and coupling an additional resistor R1040 in series with resistor R1030. As stated above, the isolation means 905 may be implemented using one or more opto-isolators.

Also disclosed herein is an apparatus for monitoring a battery pack. The battery pack has two or more serially connected rechargeable batteries. The apparatus comprises a detection means for detecting cell reversal in said battery pack. The apparatus further comprises a protection means, responsive to the detection means, for limiting current drawn from the battery pack upon detection of cell reversal. In one embodiment, the protection means comprises a motor regulating means, responsive to the detection means, for limiting voltage powering an electric motor that is drawing current from the battery pack, thereby limiting current drawn by the electric motor from the battery pack upon detection of cell reversal. The motor regulating means regulates a voltage control signal transmitted from a motor throttle to a motor control unit whereby, upon detection of cell reversal by the detection means, the motor regulating means adjusts the voltage control signal causing the motor control unit to limit the voltage powering the electric motor. An implementation of the voltage regulating means has been discussed above.

Also disclosed herein is a method of detecting cell reversal in a battery pack having a plurality of serially connected rechargeable batteries. The method comprises the step of dividing the battery pack into N serially connected battery segments ($S_1 \ldots S_N$) where N is an integer greater than or equal to one. Generally, each battery segment includes two or more of the serially connected rechargeable batteries. The number of batteries in each of the battery segments ($S_1 \ldots S_N$) need not be the same.

The method also comprises the step of connecting each of N divider networks ($D_1 \ldots D_N$) across the respective of the battery segments ($S_1 \ldots S_N$). Hence, divider network $D_i$ is connected across battery segment $S_i$. Each divider network $D_i$ includes a first divider resistor serially connected to a second divider resistor at a resistor junction.

The method also comprises the step of locating each of N test points ($P_1 \ldots P_N$) at a junction between two batteries located within the respective of the battery segments ($S_1 \ldots S_N$). Hence, test point $P_i$ is located at a junction between two batteries within battery segment $S_i$. Each test point $P_i$ divides the respective battery segment $S_i$ into a first and a second subsegment. The number of batteries in the first and second subsegment need not be the same.

Preferably, the first and said second divider resistors of each divider network $D_i$ are be sized so that the nominal voltage at each test point $P_i$ is substantially equal to the nominal voltage at the resistor junction of the respective divider network $D_i$.

The method also comprises the steps of comparing voltage at each test point $P_i$ to voltage at the resistor junction of the respective divider network $D_i$, and providing a detection signal when the absolute value of the difference between the voltage at any test point $P_i$ and the voltage at the resistor junction of the respective divider network $D_i$ is greater than a predetermined value. Preferably, the predetermined values is less than or equal to one-half the difference between the nominal battery voltage and the battery voltage after cell reversal. More preferably, the predetermined value is less than or equal to one-half the nominal battery voltage.

Also disclosed herein is a method of detecting cell reversal in a battery pack having a plurality of serially connected rechargeable batteries. The method comprises the step of dividing the battery pack into N serially connected battery segments ($S_1 \ldots S_N$) where N is an integer greater than or equal to one, each of the battery segments includes two or more serially connected rechargeable batteries. The number of batteries in each of the battery segments ($S_1 \ldots S_N$) need not be the same.

The method also comprises the step of connecting each of N divider networks ($D_1 \ldots D_N$) across the respective of the battery segments ($S_1 \ldots S_N$). Hence, each divider network $D_i$ is connected across the respective battery segment $S_i$. Each divider network $D_i$ includes a first divider resistor serially connected to a second divider resistor through a voltage drop device. Preferably, each voltage drop device includes one or more voltage regulator diodes. Examples of voltage regulator diodes are the Motorola LM285/LM385 series.

The method also includes the step of locating each of N test points ($P_1 \ldots P_N$) at a junction between two batteries within the respective of the battery segments ($S_1 \ldots S_N$). Hence, each test point $P_i$ is located at a junction between two batteries within the respective battery segment $S_i$. Each test point $P_i$ further divides the respective battery segment $S_i$ into two subsegments, a first subsegment and a second subsegment. The number of batteries in each of the subsegments need not be the same.

Preferably, the first and second divider resistors of each divider network $D_i$ are sized so that the nominal voltage at each test point $P_i$ is substantially equal to the average of the nominal voltages on opposite terminals of the voltage drop device of the respective divider network $D_i$. Preferably, the voltage drop across each voltage drop device is chosen to be less than or equal to the difference between the nominal battery voltage and the battery voltage after cell reversal. More preferably, the voltage drop across each voltage drop device is chosen to be less than the nominal battery voltage.

The method also includes the steps of comparing voltage at each test point $P_i$ to a voltage window defined by the voltages at opposite terminals of the voltage drop device of the respective divider network $D_i$, and providing a detection signal when the voltage at any test point $P_i$ is outside the voltage window across the voltage drop device of the respective divider network $D_i$.

In the discussion above, the battery pack comprises a plurality of serially connected rechargeable batteries. The one or more terminal points divide the battery pack into a plurality of serially connected battery segments. Each battery segment is comprised of one or more serially connected rechargeable batteries.

The present invention is also applicable to a "generalized" battery pack configuration. A "generalized" battery pack is defined herein as a battery pack in which one or more of the battery segments ($S_1 \ldots S_N$) have been replaced with a "generalized" battery segment. A generalized battery segment comprises two or more regular battery segments connected in parallel (where each of the regular battery segments includes two or more serially connected batteries).

An example of a generalized battery pack 1201 is shown in FIG. 12. It includes two generalized battery segments 1205 and 1007. Each of the generalized battery segments 1205, 1207 includes four regular battery segments 1210 and 1212, respectively, that have been connected in parallel. Each of the battery segments 1210 includes two serially connected batteries 1214, while each of the battery segments 1212 is comprised three serially connected batteries 1214.

As described above, the disclosed invention detects drops in battery voltage due to cell reversal. However, the present invention can also detect drops in battery voltage occurring for reasons other than cell reversal. For example, an increase in the internal resistance of a battery (possibly due to internal overheating) may cause the voltage of the battery to drop. This voltage drop can be detected by the apparatus and methods disclosed herein.

While the invention has been described in connection with preferred embodiments and procedures, it is to be understood that it is not intended to limit the invention to the preferred embodiments and procedures. On the contrary, it is intended to cover all alternatives, modifications and equivalence which may be included within the spirit and scope of the invention as defined by the claims appended hereinafter.

We claim:

1. An apparatus for monitoring a battery pack having two or more serially connected rechargeable batteries, said battery pack divided into N serially connected battery segments ($S_1 \ldots S_N$) where N is an integer greater than or equal to one, each of said battery segments ($S_1 \ldots S_N$) having two or more of said serially connected rechargeable batteries, said apparatus comprising:

a detection means for detecting cell reversal in said battery pack, said detection means comprising:

N divider networks ($D_1 \ldots D_N$), each including a first divider resistor serially connected to a second divider resistor at a resistor junction, each of said divider networks ($D_1 \ldots D_N$) connected across the respective of said battery segments ($S_1 \ldots S_N$);

N test points ($P_1 \ldots P_N$) each located at a junction between two of said rechargeable batteries within the respective of said battery segments ($S_1 \ldots S_N$);

a voltage comparison means for comparing voltage at each of said test points ($P_1 \ldots P_N$) to voltage at said resistor junction of the respective of said divider networks ($D_1 \ldots D_N$); and N voltage drop devices ($VD_1 \ldots VD_N$), each serially connected between said first divider resistor and said second divider resistor of the respective of said divider networks ($D_1 \ldots D_N$), wherein said voltage comparison means compares voltage at each of said test points ($P_1 \ldots P_N$) to a voltage window defined by voltage at opposite terminals of the respective of said voltage drop devices ($VD_1 \ldots VD_N$), said voltage comparison means providing a detection signal when voltage at any one of said test points ($P_1 \ldots P_N$) is outside said voltage window of the respective of said voltage drop devices ($VD_1 \ldots VD_N$).

2. The apparatus of claim 1, wherein voltage drop across each of said voltage drop devices ($VD_1 \ldots VD_N$) is less than or equal to nominal battery voltage.

3. The apparatus of claim 1, wherein said first and said second divider resistors of each of said divider networks ($D_1 \ldots D_N$) are sized so that nominal voltage at each of said test points ($P_1 \ldots P_N$) is the average of nominal voltage at opposite terminals of the respective of said voltage drop devices ($VD_1 \ldots VD_N$).

4. The apparatus of claim 1, wherein said voltage comparison means includes one or more window comparators.

5. The apparatus of claim 1, wherein each of said voltage drop devices ($VD_1 \ldots VD_N$) includes one or more voltage regulator diodes.

6. The apparatus of claim 1, further comprising:
a protection means, responsive to said detection means, for limiting current drawn from said battery pack upon detection of cell reversal.

7. The apparatus of claim 6, wherein said protection means comprises a motor regulating means, responsive to said detection means, for limiting voltage powering an electric motor that is drawing current from said battery pack.

8. The apparatus of claim 7, wherein said motor regulating means regulates a voltage control signal transmitted from a motor throttle to a motor control unit whereby, upon detection of cell reversal by said detection means, said motor regulating means adjusts said voltage control signal causing said motor control unit to limit said voltage powering said electric motor.

9. An apparatus for monitoring a battery pack having a plurality of serially connected rechargeable batteries, a positive battery pack terminal, and a negative battery pack terminal, said apparatus comprising:
a detection means for detecting cell reversal in said battery pack, said detection means comprising:
N test points ($P_1 \ldots P_N$) each located at a unique junction between two of said batteries of said battery pack, N being an integer greater than or equal to one, said test points ($P_1 \ldots P_N$) sequentially ordered from high to low voltage;
a divider network including N+1 serially connected divider resistors ($DR_1 \ldots DR_{N+1}$), said divider resistors ($DR_1 \ldots DR_{N+1}$) forming N resistor junctions ($J_1 \ldots J_N$) where each of said resistor junctions ($J_1 \ldots J_N$) is between the respective of said divider resistors ($DR_1 \ldots DR_{N+1}$) and the next of said divider resistors ($DR_1 \ldots DR_{N+1}$), said divider network connected across said battery pack wherein first of said divider resistors ($DR_1 \ldots DR_{N+1}$) is connected to said positive battery pack terminal, and last of said divider resistors ($DR_1 \ldots DR_{N+1}$) is connected to said negative battery pack terminal;
a voltage comparison means for comparing voltage at each of said test points ($P_1 \ldots P_N$) to voltage at the respective of said resistor junctions ($J_1 \ldots J_N$); and
N voltage drop devices ($VD_1 \ldots VD_N$) each serially connected between the respective of said divider resistors ($DR_1 \ldots DR_{N+1}$) and the next of said divider resistors ($DR_1 \ldots DR_{N+1}$), said voltage comparison means compares voltage at each of said test points ($P_1 \ldots P_N$) to a voltage window defined by voltage at opposite terminals of the respective of said voltage drop devices ($VD_1 \ldots VD_N$).

10. The apparatus of claim 9, wherein said voltage comparison means provides a detection signal when voltage at any one of said test points ($P_1 \ldots P_N$) is outside said voltage window of the respective of said voltage drop devices ($VD_1 \ldots VD_N$).

11. The apparatus of claim 9, wherein voltage drop across each of said voltage drop devices ($VD_1 \ldots VD_N$) is less than or equal to nominal battery voltage.

12. The apparatus of claim 9, wherein said divider resistors ($DR_1 \ldots DR_{N+1}$) are sized so that nominal voltage at each of said test points ($P_1 \ldots P_N$) is the average of nominal voltages on opposite terminals of the respective of said voltage drop devices ($VD_1 \ldots VD_N$).

13. The apparatus of claim 9 further comprising:
a protection means, responsive to said detection means, for limiting current drawn from said battery pack upon detection of cell reversal.

14. A method of detecting cell reversal in a battery pack having two or more serially connected rechargeable batteries, said method comprising the steps of:
dividing said battery pack into N serially connected battery segments ($S_1 \ldots S_N$) wherein N is an integer greater than or equal to one, each of said battery segments including two or more of said serially connected rechargeable batteries;
connecting each of N divider networks ($D_1 \ldots D_N$) across the respective of said battery segments ($S_1 \ldots S_N$), each of said divider networks ($D_1 \ldots D_N$) including a first divider resistor serially connected to a second divider resistor through a voltage drop device;
locating each of N test points ($P_1 \ldots P_N$) at a junction between two of said rechargeable batteries within the respective of said battery segments ($S_1 \ldots S_N$);
comparing voltage at each of said test points ($P_1 \ldots P_N$) to a voltage window defined by voltage at opposite terminals of said voltage drop device of the respective of said divider networks ($D_1 \ldots D_N$); and
providing a detection signal when voltage at any one of said test points ($P_1 \ldots P_N$) is outside said voltage window across said voltage drop device of the respective of said divider networks ($D_1 \ldots D_N$).

15. The method of claim 14, wherein said first and said second divider resistors of each of said divider networks ($D_1 \ldots D_N$) are sized so that nominal voltage at each of said test points ($P_1 \ldots P_N$) is substantially equal to the average of nominal voltage at opposite terminals of said voltage drop device of the respective of said divider networks ($D_1 \ldots D_N$).

16. The method of claim 14, wherein voltage drop across said voltage drop device of each of said divider networks ($D_1 \ldots D_N$) is less than or equal to nominal battery voltage.

17. The method of claim 14, wherein said voltage drop device of each of said divider networks ($D_1 \ldots D_N$) includes one or more voltage regulator diodes.

* * * * *